(12) United States Patent
Hoshino et al.

(10) Patent No.: US 8,311,072 B2
(45) Date of Patent: Nov. 13, 2012

(54) SURFACE EMITTING LASER ARRAY AND PRODUCTION METHOD THEREFOR

(75) Inventors: Katsuyuki Hoshino, Tokyo (JP); Shoichi Kawashima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 185 days.

(21) Appl. No.: 12/773,424

(22) Filed: May 4, 2010

(65) Prior Publication Data

US 2010/0284432 A1 Nov. 11, 2010

(30) Foreign Application Priority Data

May 7, 2009 (JP) .................................. 2009-112481

(51) Int. Cl.
*H01S 5/18* (2006.01)
*H01S 5/12* (2006.01)

(52) U.S. Cl. ................................. 372/50.124; 372/44.01

(58) Field of Classification Search ............... 372/44.01, 372/50.124
See application file for complete search history.

(56) References Cited

U.S. PATENT DOCUMENTS

| | | | |
|---|---|---|---|
| 2005/0179025 A1* | 8/2005 | Okuyama et al. | 257/13 |
| 2007/0280318 A1* | 12/2007 | Yoshimoto et al. | 372/43.01 |
| 2009/0103583 A1* | 4/2009 | Tanaka et al. | 372/45.01 |

FOREIGN PATENT DOCUMENTS

JP 2003-273456 A 9/2003

OTHER PUBLICATIONS

Hiramatsu et al., "Fabrication and characterization of low defect density GaN using facet-controlled epitaxial lateral overgrowth (FACELO)", Journal of Crystal Growth, vol. 221, pp. 316-326, 2000.
Matsubara et al., "GaN Photonic-Crystal Surface Emitting Laser at Blue-Violet Wavelengths", Science, vol. 319, pp. 445-447, Jan. 25, 2008.

* cited by examiner

*Primary Examiner* — Jessica Stultz
*Assistant Examiner* — Michael Carter
(74) *Attorney, Agent, or Firm* — Canon U.S.A., Inc. IP Division (57) ABSTRACT

A surface emitting laser array having a plurality of surface emitting lasers arranged in an array, each of the surface emitting lasers being provided with a two-dimensional photonic crystal having a resonance mode in an in-plane direction and with an active layer. The surface emitting laser has a mesa-shaped inclined side wall surface. When a maximum light-receiving angle with respect to the mesa-shaped inclined side wall surface at which an incident light is coupled with a waveguide containing the two-dimensional photonic crystal is denoted as $\theta max°$, an angle formed by a plane of the two-dimensional photonic crystal and the mesa-shaped inclined side wall surface is controlled so as to exceed $(90+\theta max)°$ or be smaller than $(90-\theta max)°$.

5 Claims, 5 Drawing Sheets

SURFACE EMITTING LASER ARRAY AND PRODUCTION METHOD THEREFOR

BACKGROUND OF THE INVENTION

1. Field of the Invention

The present invention relates to a surface emitting laser array provided with a two-dimensional photonic crystal, and a production method therefor.

2. Description of the Related Art

A surface emitting laser is known among surface emitting lasers, which makes use of a two-dimensional photonic crystal as a reflector.

The surface emitting laser using the two-dimensional photonic crystal has been actively studied (see Science, Vol. 319, pp. 445-447, 25 Jan. 2008) particularly for a surface emitting laser using a nitride semiconductor which can emit a light of a region from near ultraviolet to green, because a distributed Bragg reflector which is generally used is hardly produced for the surface emitting laser.

Japanese Patent Application Laid-Open No. 2003-273456 discloses a surface emitting laser which is provided with the two-dimensional photonic crystal and has a light reflection region provided in the periphery of the two-dimensional photonic crystal in a horizontal direction to the crystal face in order to enhance the use efficiency of light.

The surface emitting laser having this structure makes the above described light reflection region reflect toward the two-dimensional photonic crystal a part of the light which has leaked from the two-dimensional photonic crystal in the horizontal direction in order to enhance the use efficiency of light.

SUMMARY OF THE INVENTION

In the above described Japanese Patent Application Laid-Open No. 2003-273456, the surface emitting laser provides a light reflection region in the periphery of the two-dimensional photonic crystal in the direction perpendicular to the crystal face of the two-dimensional photonic crystal to make the light reflection region reflect toward the two-dimensional photonic crystal a part of the light which has leaked from the two-dimensional photonic crystal, and thereby enhances the use efficiency of light.

By the way, the above described light reflection region is a reflector using a difference between refractive indices, and it is difficult for the reflector to increase the reflectance.

Because of this, most of the light which has leaked from the two-dimensional photonic crystal results in leaking to the outside of the light reflection region.

However, this Japanese Patent Application Laid-Open No. 2003-273456 assumes the case in which the above described surface emitting laser is single, and accordingly even when the light leaks to the outside of the light reflection region as was described above, there is little influence due to the leakage.

In contrast to this, when a plurality of the above described surface emitting lasers are arranged in an arrayed form, the light which has leaked to the outside of the above described light reflection region propagates in the horizontal direction of the above described two-dimensional photonic crystal. Then, the light results in being coupled with the two-dimensional photonic crystal in the inner part of another surface emitting laser which is arranged adjacent thereto, through the light reflection region.

As a result, such a problem occurs that the light causes crosstalk with the adjacent surface emitting laser.

With respect to the above described problem, an object of the present invention is to provide a surface emitting laser array provided with a two-dimensional photonic crystal, which can reduce the crosstalk with the adjacent surface emitting laser, and a production method therefor.

In an aspect of the invention, there is provided a surface emitting laser array comprising a plurality of surface emitting lasers arranged in an array, each of the surface emitting lasers being provided with a two-dimensional photonic crystal having a resonance mode in an in-plane direction and with an active layer, wherein the surface emitting laser has a mesa-shaped inclined side wall surface, and wherein when a maximum light-receiving angle with respect to the mesa-shaped inclined side wall surface at which an incident light is coupled with a waveguide containing the two-dimensional photonic crystal is denoted as $\theta max°$, an angle formed by a plane of the two-dimensional photonic crystal and the mesa-shaped inclined side wall surface is controlled so as to exceed $(90+\theta max)°$ or be smaller than $(90-\theta max)°$.

In another aspect of the invention, there is provided a method for producing a surface emitting laser array comprising a plurality of arranged surface emitting lasers each provided with a two-dimensional photonic crystal having a resonance mode in an in-plane direction and with an active layer, the method comprising the steps of; forming a mask for selective growth having an opening aperture on a substrate, forming a semiconductor layer provided with a mesa-shaped inclined side wall surface by selective growth starting from the aperture, and forming the two-dimensional photonic crystal in the semiconductor layer, wherein, in the step of forming the semiconductor layer, when a maximum light-receiving angle with respect to the inclined side wall surface at which an incident light couples with a waveguide containing the two-dimensional photonic crystal is denoted as $\theta max°$, the semiconductor layer is formed so that an angle formed by a plane of the two-dimensional photonic crystal and the mesa-shaped inclined side wall surface exceeds $(90+\theta max)°$ or is smaller than $(90-\theta max)°$.

The present invention can realize a surface emitting laser array provided with a two-dimensional photonic crystal which can reduce the crosstalk with the adjacent surface emitting laser, and a production method therefor.

Further features of the present invention will become apparent from the following description of exemplary embodiments with reference to the attached drawings.

BRIEF DESCRIPTION OF THE DRAWINGS

FIGS. 2A, 2B and 2C are results of having calculated the maximum inclination angle of the side wall surface of the surface emitting laser according to the embodiment of the present invention.

DESCRIPTION OF THE EMBODIMENTS

Preferred embodiments of the present invention will now be described in detail in accordance with the accompanying drawings.

A surface emitting laser array will be described below with reference to FIGS. 1A and 1B, in which surface emitting lasers each provided with a two-dimensional photonic crystal according to the embodiment of the present invention are arranged in an array.

Figure 1A:
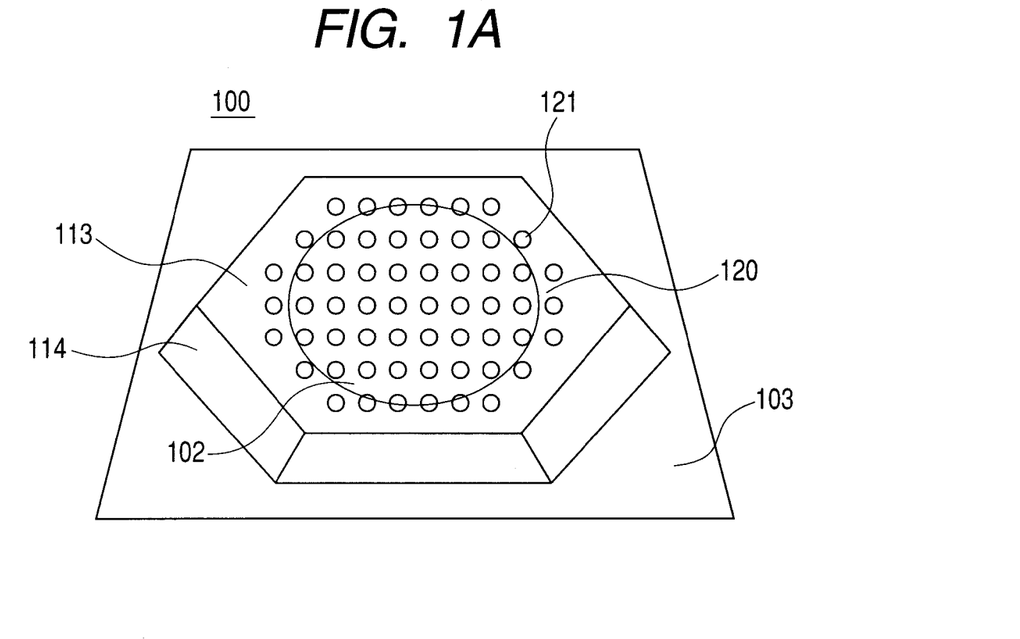
FIGS. 1A and 1B are views for describing a structure of a surface emitting laser provided with a two-dimensional photonic crystal according to an embodiment of the present invention.
Figure 1B:
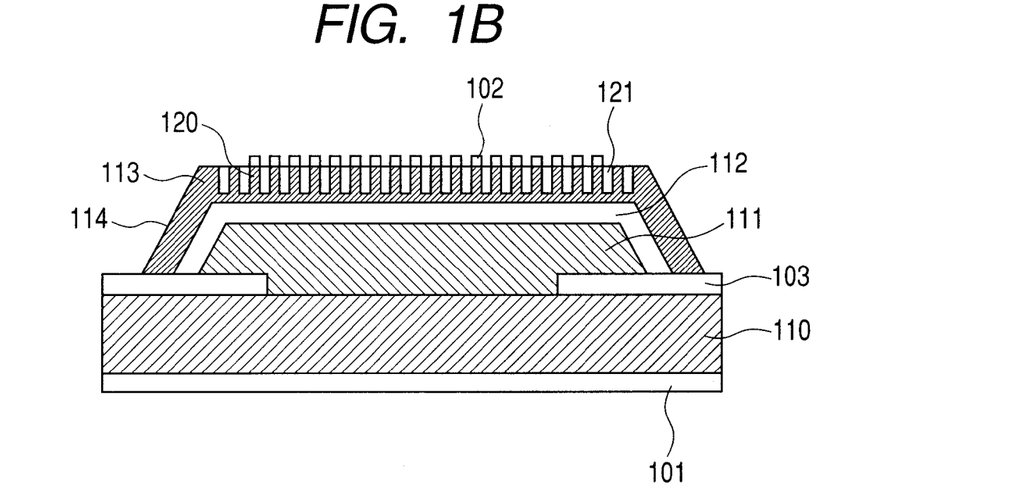

FIGS. 1A and 1B are views for illustrating a structure of the surface emitting laser 100 according to the present embodiment, which constitutes the surface emitting laser array and is formed in the shape of a mesa. Firstly, a process of producing a waveguide layer 113 which contains a two-dimensional photonic crystal 120 and has a mesa-shaped inclined side wall surface will be described below.

A mask 103 for selective growth, which is made of silicon dioxide, for instance, is formed on a substrate 110 and suppress the crystal growth of the semiconductor layer, and an aperture is formed in the mask which has been formed for selective growth on the substrate.

The aperture can be formed into various shapes, and can employ a shape of, for instance, a circle, a hexagon and a tetragon.

Next, crystals of a thin-film semiconductor layer are grown on the substrate 110 on which the mask 103 for selective growth has been formed, with an MOCVD method in the following way.

Specifically, crystals of the thin-film semiconductor layer made of n-type AlGaN, for instance, are grown on the mask 103 for selective growth starting from the aperture by controlling the lateral growth so that a {1-101} face can be formed.

Thereby, a lower cladding layer 111 which has the side wall surface made of the {1-101} face and has a trapezoidal sectional shape is formed on the mask 103 for selective growth.

A structure like this can be formed by using such a growth condition as to control the growth rate of each crystal face as is described in Journal of Crystal Growth, Vol. 221, pp. 316-326, 2000.

The growing pressure is set at 80 Torr, and the growing temperature is set at 1,050° C., for instance.

In the present embodiment, the case was described in which the MOCVD method is used for crystal growth. However, for instance, an MBE method (molecular beam epitaxy method) may be used as the crystal growth method.

Next, an active layer 112 and a guide layer 113 are deposited in this order so as to cover the lower cladding layer 111.

Then, a resist having the shape of a two-dimensional photonic crystal, which is two-dimensionally and periodically arrayed in an in-plane direction and has a resonance mode in the in-plane direction, is formed on the guide layer 113 with an electron beam exposure technique.

Subsequently, the guide layer 113 is dry-etched while using the above described resist as a mask. Afterward, the resist is removed. Thereby, the guide layer 113 containing the two-dimensional photonic crystal 120 is formed.

As described above, in the present embodiment, the inclined side wall surface 114 is formed of the {1-101} face with a selective growth method with the use of the mask 103 for selective growth.

However, a method of forming the side wall surface 114 which is inclined at a predetermined angle is not particularly limited to the above described forming method. The side wall surface 114 may be formed of a {11-22} face or with another method such as a dry etching method, for instance.

In the above described Japanese Patent Application Laid-Open No. 2003-273456, a light reflection region is provided in the periphery of the two-dimensional photonic crystal, specifically, on a side wall surface in a direction perpendicular to the crystal face of the two-dimensional photonic crystal.

Thereby, the light reflection region reflects a part of the light which has leaked from the two-dimensional photonic crystal toward the two-dimensional photonic crystal to enhance the use efficiency of light.

Thus, in Japanese Patent Application Laid-Open No. 2003-273456, the inclination angle on the side wall surface is determined so as to reflect the light from the inner part of the surface emitting laser at a predetermined angle.

In contrast to this, in the present embodiment, the inclination angle of the side wall surface is determined so that the light coming from the outside of the surface emitting laser can be refracted at a predetermined angle, as described above.

Next, the specific structure will be further described below, which enables the crosstalk with the adjacent laser to be reduced by forming the thus inclined side wall surface in the surface emitting laser array according to the present embodiment.

Here, the following calculation was conducted so as to confirm such a range of the inclination angle of the side wall surface in the surface emitting laser that the light which has propagated to the inner part of the surface emitting laser from the outside of the surface emitting laser according to the present embodiment does not couple with the two-dimensional photonic crystal.

Figures 2A, 2B:
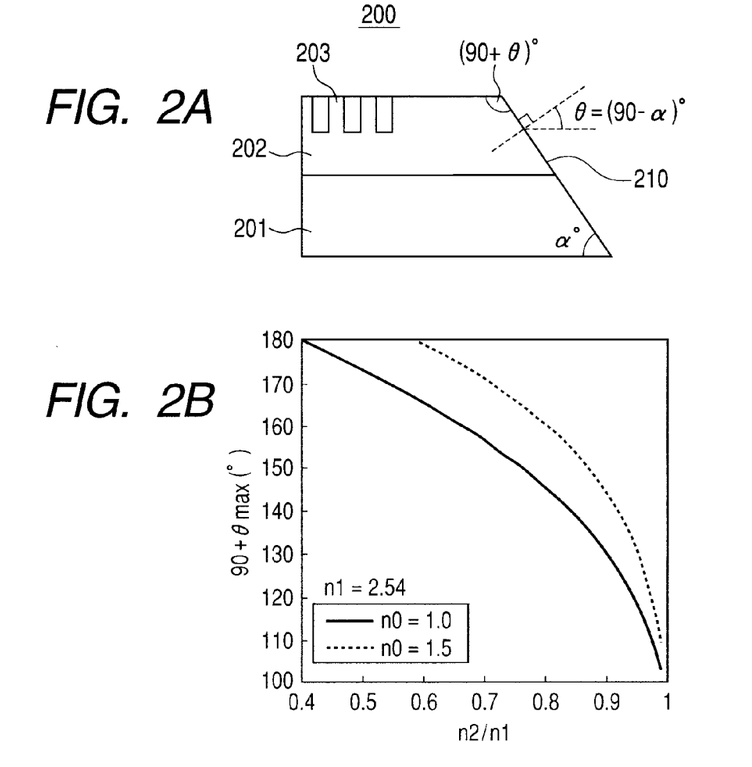
FIG. 2A is a schematic view of a structure which has been used in the calculation.
FIGS. 2B and 2C are results of having calculated $(90+\theta max)°$.

Specifically, an optical path in the inner part of the surface emitting laser 200 illustrated in FIG. 2A was calculated.

The refractive index of the guide layer 202 was denoted as $n_1$, the refractive index of the cladding layer 201 as $n_2$, and the refractive index of the outside as $n_0$.

In addition, the angle formed by the side wall surface 210 and the bottom face of the cladding layer 201 was denoted as $\alpha°$, and the angle formed by a line perpendicular to the side wall surface 210 and a light incident on the side wall surface 210 from the outside was denoted as $\theta° = (90-\alpha)°$. Here, the incident light from the outside was assumed to be incident in a horizontal direction with respect to the plane of the two-dimensional photonic crystal 203.

If the incident light from the outside through the side wall surface did not satisfy the total reflection condition on the interface between the guide layer 202 and the cladding layer 201, the incident light propagates to the cladding layer 201 and is not coupled with the two-dimensional photonic crystal 203.

Then, the maximum light-receiving angle with respect to the inclined side wall surface, at which the total reflection condition on the interface between the guide layer 202 and the cladding layer 201 is satisfied, in other words, the incident light is coupled with a waveguide containing the two-dimensional photonic crystal 203, was denoted as $\theta_{max}°$, and the $\theta_{max}°$ was calculated according to the Snell's law.

FIG. 2B illustrates a calculation result of $(90+\theta_{max})°$ with respect to the ratio $n_2/n_1$ of the refractive index of the guide layer 202 to the refractive index of the cladding layer 201, where the refractive index $n_1$ of the guide layer 202 is assumed to be 2.54 (refractive index of GaN).

Here, the (90+θmax)° was calculated in two cases in which the refractive index $n_0$ of the outside was assumed to be 1.0 (refractive index of the air) and to be 1.5 (refractive index of silicon dioxide).

When the angle formed by the plane of the two-dimensional photonic crystal 203 and the side wall surface 210 is larger than (90+θmax)°, the light which has been incident from the outside does not cause the total reflection on the interface between the guide layer 202 and the cladding layer 201, and does not propagate through the guide layer 202.

For this reason, the light which has been incident from the outside is not coupled with the two-dimensional photonic crystal 203.

For instance, when it is assumed that the refractive index $n_1$ of the guide layer 202 is 2.54 (refractive index of GaN), the refractive index $n_2$ of the cladding layer 201 is 2.50 (refractive index of AlGaN) and the refractive index $n_o$ of the outside is 1.0 (refractive index of the air), the (90+θmax)° becomes 106.6°.

In other words, if the side wall surface 210 is inclined so that the angle formed by the guide layer 202 containing the two-dimensional photonic crystal 203 and the side wall surface 210 is larger than 106.6°, coupling of a light incident from the outside with the photonic crystal 203 can be suppressed.

When the side wall surface 210 has a reverse mesa shape, the light which has been incident from the outside when the angle formed by the surface of the two-dimensional photonic crystal 203 and the side wall surface 210 is smaller than (90−θmax)° does not cause the total reflection on the interface between the guide layer 202 and the cladding layer 201 according to the Snell's law.

Therefore, the light which has been incident from the outside is not coupled with the two-dimensional photonic crystal 203.

Figure 2C:
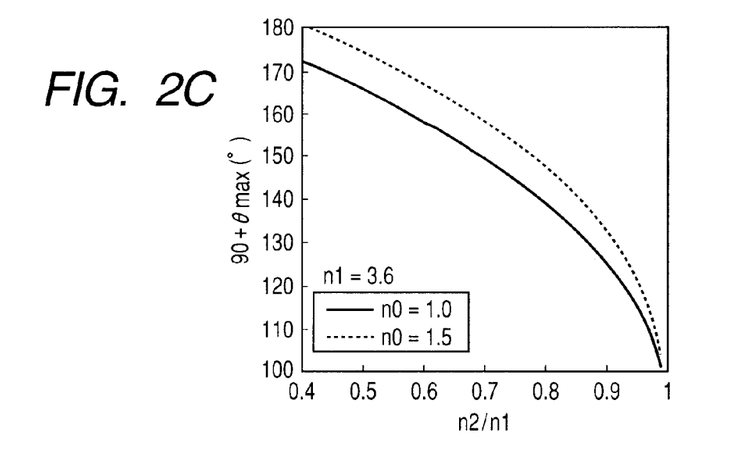

FIG. 2C illustrates a calculation result of (90+θmax)° with respect to the ratio $n_2/n_1$ of the guide layer 202 to the cladding layer 201 when the refractive index $n_1$ of the guide layer 201 was assumed to be 3.6 (refractive index of GaAs).

When the refractive index $n_1$ of the guide layer 201 was assumed to be 3.6, the obtained curve shows the same tendency obtained when the refractive index $n_1$ was assumed to be 2.54.

Here, most of the light which has leaked from two-dimensional photonic crystal 203, has propagated to the guide layer 202 and has reached the side wall surface 210 is not reflected but is emitted to the outside because the side wall surface 210 inclines.

In addition, even when the inclined side wall surface 114 is formed with the selective growth method using the above described mask 103 for selective growth as illustrated in FIGS. 1A and 1B, the light which has leaked from the two-dimensional photonic crystal 120 is emitted to the outside in the following way.

That is to say, most of the light which has leaked from the two-dimensional photonic crystal 120 is not reflected but is emitted to the outside, because the guide layer 113 largely turns in the region of the side wall surface 114.

Thereby, such a secondary effect can be also expected as to be capable of radiating an effective reflected return light to the outside of the guide layer and reducing the instability of the resonance mode in the two-dimensional photonic crystal.

When the surface emitting laser array provided with the two-dimensional photonic crystal is structured in the above way, the light which has leaked to the periphery of the two-dimensional photonic crystal from the two-dimensional photonic crystal propagates to the waveguide containing the two-dimensional photonic crystal.

Then, the light is emitted to the outside of the waveguide, at the mesa-shaped side wall surface of the surface emitting laser.

The light which has been emitted to the outside reaches the surface emitting laser which is arranged adjacent thereto. However, the side wall surface of the surface emitting laser having the structure of the present embodiment inclines at the maximum light-receiving angle of the waveguide in the inner part or larger, and accordingly it is not coupled with the waveguide.

Thereby, the surface emitting laser can reduce the crosstalk with the adjacent laser.

EXEMPLARY EMBODIMENT

Next, exemplary embodiments according to the present invention will be described below.

Exemplary Embodiment 1

In Exemplary embodiment 1, a surface emitting laser which is provided with a two-dimensional photonic crystal and is constituted by applying the present invention thereto will be described with reference to FIGS. 1A and 1B.

The surface emitting laser 100 in the present exemplary embodiment includes a p-type guide layer 113 containing a two-dimensional photonic crystal 120, an active layer 112, an n-type cladding layer 111, an n-type contact layer 110 and electrodes 101 and 102.

The p-type guide layer 113 containing the two-dimensional photonic crystal and the n-type contact layer 110 are formed of a p-type and n-type GaN semiconductor layers respectively, for instance.

The p-type light guide layer 113 containing the two-dimensional photonic crystal and the n-type cladding layer 111 function as a conductive layer in which a carrier to be injected into the active layer 112 conducts.

The active layer 112 which is formed of a multiple quantum well structure with the use of a nitride semiconductor material, and a well layer and a barrier layer in the quantum well structure are made of InGaN and GaN respectively.

The band gap of the well layer is smaller than those of the barrier layer and the p-type light guide layer 113 containing the two-dimensional photonic crystal.

The active layer 112 emits light when the carrier is injected. The active layer 112 in the present exemplary embodiment has the above described multiple quantum well structure, but may have a single quantum well structure.

An n-type electrode 101 and a p-type electrode 102 which are made of Au (gold) are formed on the rear surface of the n-type contact layer 110 and the surface of the p-type guide layer 113 containing the two-dimensional photonic crystal respectively.

However, the electrode material in the present exemplary embodiment is not particularly limited to Au, and may employ another material.

The active layer 112 emits light when voltage is applied between the electrodes 101 and 102, and the light which has leaked out from the active layer 112 is incident on the two-dimensional photonic crystal 120.

The light corresponding to a predetermined period of the photonic crystal 120 is repeatedly diffracted by the photonic crystal 120 to generate a standing wave of which the phase condition is specified.

The light of which the phase has been specified by the photonic crystal 120 is fed back to the light in the active layer 112 by diffraction to generate a standing wave.

This standing wave satisfies the wavelength and phase condition of the light, which are specified in the photonic crystal 120.

Thereby, the light is resonated in the photonic crystal 120 to be amplified, and a coherent light is emitted from the surface of the photonic crystal 120 in a direction perpendicular to the surface.

The two-dimensional photonic crystal 120 is formed of photonic crystal periodic structures 121 which are arrayed in a lattice form.

The photonic crystal periodic structure 121 in the present exemplary embodiment is preferably made of the air (refractive index of 1.0) which can have a large difference between the refractive index of itself and the refractive index of the semiconductor layer (2.54 in the case of GaN) that forms the two-dimensional photogenic crystal. However, the photonic crystal periodic structure 121 may be formed of a dielectric material having a lower refractive index than the semiconductor which forms the two-dimensional photonic crystal.

The usable dielectric materials which form the photonic crystal periodic structure 121 and have the low refractive index include silicon dioxide (refractive index of 1.5) and silicon nitride ($SiN_x$), for instance.

Next, a method for producing a surface emitting laser array according to the present exemplary embodiment will be described below. Firstly, as is illustrated in FIGS. 1A and 1B, a mask 103 for selective growth, which is made of silicon dioxide that suppress the crystal growth of a semiconductor layer thereon, is formed on an n-type contact layer 110 made of an n-type GaN substrate.

In order to do that, firstly, a resist having a circular pattern corresponding to the number of lasers to be arrayed formed therein is formed on the above described n-type contact layer 110.

Next, silicon dioxide is deposited with the use of an electron beam deposition apparatus or a sputtering apparatus, for instance.

Subsequently, the mask 103 having a circular aperture for selective growth is formed with a liftoff operation.

The shape of the aperture is not particularly limited to the circle, and may be a hexagon or a tetragon, for instance.

The method for forming the mask 103 for selective growth in the present exemplary embodiment is not particularly limited to the above described forming method, and may be a dry etching method, for instance.

In this case, firstly, silicon dioxide is deposited on the above described n-type contact layer 110.

Subsequently, a resist mask is formed on the above described film of silicon dioxide, and a predetermined pattern is formed thereon. Then, the film of silicon dioxide is dry-etched, and thereby the mask 103 for selective growth is completed.

Next, crystals of a thin-film semiconductor layer are grown on the n-type contact layer 110 having the mask 103 for selective growth formed thereon, with an MOCVD method in the following way.

Specifically, the thin-film semiconductor layer made of the n-type AlGaN is deposited by setting the growth pressure at 80 Torr and setting the growing temperature at 1,050° C., respectively.

Thereby, crystals of the n-type AlGaN can be grown while controlling the lateral growth starting from a portion not having the mask 103 for selective growth toward the mask 103 for selective growth so that a {1-101} face can be formed.

As a result, a mesa-shaped lower cladding layer 111 which has the side wall surface made of the {1-101} face is formed on the mask 103 for selective growth.

Next, an active layer 112 having a multiple quantum well structure and a guide layer 113 made of the p-type GaN are laminated in this order so as to cover the lower cladding layer 111.

Figure 3A:
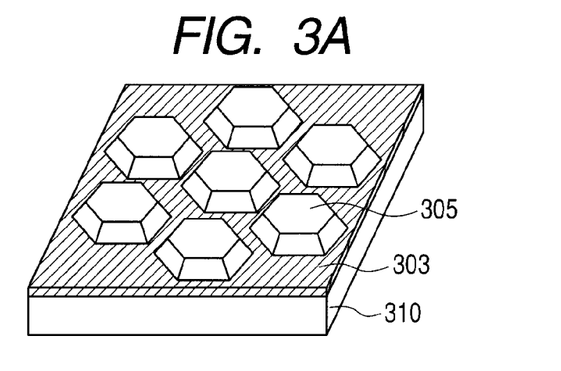
FIGS. 3A, 3B and 3C are views illustrating steps of forming the two-dimensional photonic crystal according to Exemplary embodiment 1 of the present invention.

Thereby, semiconductor multilayer film structures 305 having a hexagonal shape formed into a normal mesa shape are integrated in an array form, as is illustrated in FIG. 3A.

In addition, the arrangement of the above described structures in the present exemplary embodiment can be arbitrarily controlled by changing positions of the apertures in the mask 303 for selective growth.

In order to enhance the integration degree, it is preferable to array the semiconductor multilayer film structures 305 in a triangular lattice shape instead of the hexagonal shape in the present exemplary embodiment. However, the shape is not particularly limited, and the multilayer film structures 305 may be arrayed in a square lattice shape, for instance.

Figure 3B:
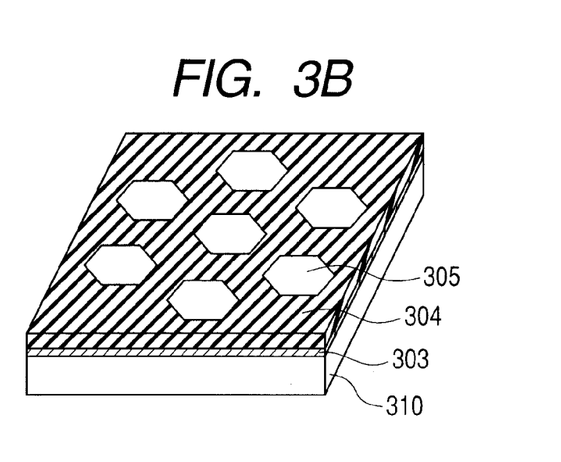

Next, a film of silicon dioxide 304 is formed in the peripheral part of the semiconductor multilayer film structures 305, as is illustrated in FIG. 3B.

Subsequently, the p-type electrode 302 is formed on the upper parts of the semiconductor multilayer film structures 305.

Next, a resist mask having a pattern of a predetermined shape is formed with an electron beam exposure technique, and the p-type electrode 302 and the upper part of the semiconductor multilayer film structure 305 are dry-etched.

Figure 3C:
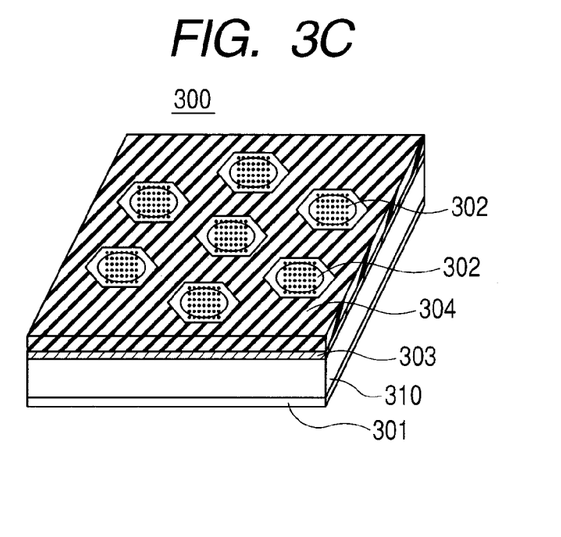

Afterward, the above described resist mask is removed. Thereby, the two-dimensional photonic crystal 302 which is two-dimensionally and periodically arrayed in an in-plane direction and has a resonance mode in the in-plane direction is formed, as is illustrated in FIG. 3C.

Next, the n-type electrode 301 is formed on the rear surface of the n-type contact layer 310 to complete the surface emitting laser array 300.

Here, in the present exemplary embodiment, each side wall surface 114 of the surface emitting laser 100 is formed of the {1-101} face of GaN.

At this time, the angle formed by the plane of the two-dimensional photonic crystal 120 and the side wall surface 114 becomes 118°. In this case, the light which has been incident from the outside does not cause the total reflection on the interface between the guide layer 113 and the cladding layer 111, and does not couple with the two-dimensional photonic crystal 120.

Accordingly, the surface emitting laser can reduce the crosstalk with adjacent lasers, resulting in enhancement of the laser characteristics.

In the present exemplary embodiment, the case was shown in which the n-type GaN substrate was used as the n-type contact layer 110.

However, the n-type contact layer 110 to be used for the surface emitting laser array of the present invention is not particularly limited to the n-type GaN substrate.

For instance, an n-type SiC substrate may be used in place of the n-type GaN substrate.

Alternatively, the n-type contact layer may be formed by growing on a sapphire substrate a thin strain-relaxed GaN buffer layer for reducing dislocation with an MOCVD method followed by growing the n-type GaN thereon.

In this case, the n-type electrode is formed after the above described thin strain-relaxed GaN buffer layer has been thermally decomposed to strip the above described sapphire substrate with a laser lift-off technique.

The method for forming the above described n-type electrode is not particularly limited to the above described forming method, and may be another method. For instance, it is also acceptable to expose a part of the n-type GaN layer from the surface side of the surface emitting laser array with a dry etching method, instead of stripping the above described sapphire substrate, and to form the n-type electrode on the exposed part.

In addition, a silicon substrate may be used instead of the sapphire substrate.

In this case, the n-type contact layer may be formed by growing a strain-relaxed GaN buffer layer for reducing dislocation, on a silicon substrate with an MOCVD method followed by growing the n-type GaN thereon.

When the n-type silicon is used for the above described silicon substrate, the n-type electrode can be formed on the rear surface of the n-type silicon substrate, and the step of stripping the substrate is unnecessary.

In the present exemplary embodiment, an n-type layer, an active layer and a p-type layer are formed in this order, but the order is not particularly limited to the above order. The p-type layer, the active layer and the n-type layer may be formed in this order.

In this case, the guide layer containing the photonic crystal results in being formed of a semiconductor layer made of the n-type GaN.

Here, the n-type GaN has a lower resistance than the p-type GaN.

For this reason, the resistance of the guide layer containing the photonic crystal with a region in which electric current flows being limited by holes constituting the photonic crystal can be reduced by forming the guide layer of the n-type GaN.

Next, another structure example in the present exemplary embodiment will be described below with reference to FIGS. 4A and 4B.

Figure 4A:
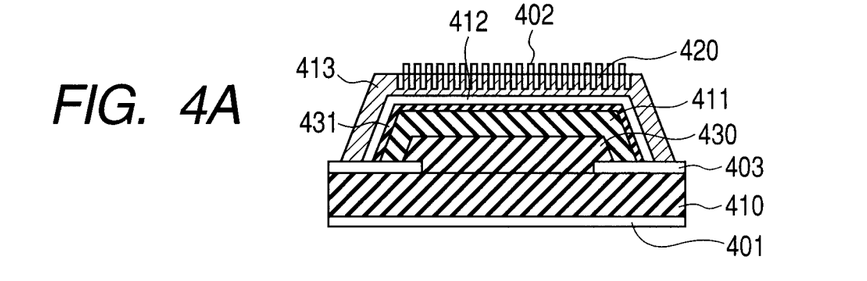
FIGS. 4A and 4B are sectional views for describing the surface emitting laser provided with the two-dimensional photonic crystal according to Exemplary embodiment 1 of the present invention.
Figure 4B:
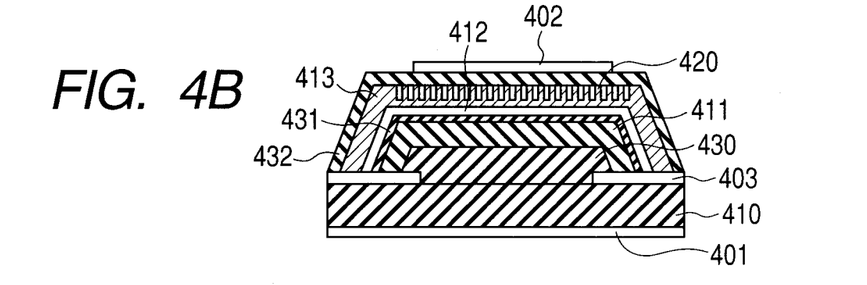

In FIGS. 4A and 4B, electrodes 401 and 402, a mask 403 for selective growth, a substrate and contact layer 410, a lower cladding layer 411 and an active layer 412 are shown.

A guide layer 413 containing a two-dimensional photonic crystal, a two-dimensional photonic crystal 420, an n-type GaN layer 430, a lower guide layer 431 and an upper cladding layer 432 are shown.

In the present exemplary embodiment, the lower cladding layer 111 is directly formed on the lower contact layer 110 made of the n-type GaN substrate, as is illustrated in FIGS. 1A and 1B.

However, as is illustrated in FIG. 4A, the lower cladding layer 411 made of the n-type AlGaN may be formed on the n-type GaN layer 430 which has been formed on the lower contact layer 410 beforehand.

When the n-type AlGaN layer 411 is formed on the n-type GaN layer 430 which has been formed beforehand with the MOCVD method, the n-type AlGaN layer 411 having higher crystalline quality can be formed compared to the case in which the n-type AlGaN layer 411 is directly formed on the n-type GaN substrate 410.

In addition, in the present exemplary embodiment, the active layer 112 is directly formed on the n-type cladding layer 111 as is illustrated in FIGS. 1A and 1B, but the active layer 412 may be formed on the lower guide layer 431 which has been formed beforehand and is made of the n-type GaN, as is illustrated in FIG. 4A.

Thereby, an SCH structure (Separated confinement heterostructure) can be formed.

For this reason, the carrier contributing to light emission is confined in the active layer 412, and the light which has been emitted from the active layer 412 is confined in the active layer 412, the lower guide layer 431 and the upper guide layer 413.

In addition, in the present exemplary embodiment, a p-type electrode is directly formed on the p-type guide layer 113 containing the two-dimensional photonic crystal.

However, the p-type electrode 402 may be formed on the upper cladding layer 432 which is made of the p-type AlGaN and has been formed on the p-type guide layer 413 beforehand, as is illustrated in FIG. 4B.

In this case, firstly, the layers are formed up to the p-type guide layer 413 containing the two-dimensional photonic crystal in the present exemplary embodiment.

Next, the two-dimensional photonic crystal 420 is embedded by the upper cladding layer 432 made of the p-type AlGaN with a growth method, as is disclosed in Science, Vol. 319, pp. 445-447, 25 Jan. 2008.

By increasing the distance between the two-dimensional photonic crystal 420 and the p-type electrode 402, it is possible to prevent light introduced into the two-dimensional photonic crystal 420 from being absorbed by the p-type electrode 402 made of a metal.

For this reason, the characteristics of the above described surface emitting laser can be enhanced compared to the case in which the electrode is arranged in the vicinity of the two-dimensional photonic crystal.

Exemplary Embodiment 2

A surface emitting laser array provided with the two-dimensional photonic crystal, which will be described in Exemplary embodiment 2, has a two-dimensional photonic crystal formed in the lower side of the active layer, which is different from Exemplary embodiment 1.

Figure 5A:
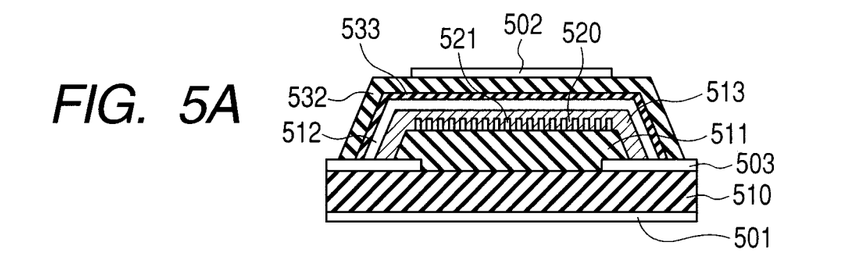
FIGS. 5A and 5B are sectional views for describing the surface emitting lasers provided with the two-dimensional photonic crystals according to Exemplary embodiment 2 and Exemplary embodiment 3 of the present invention.
Figure 5B:
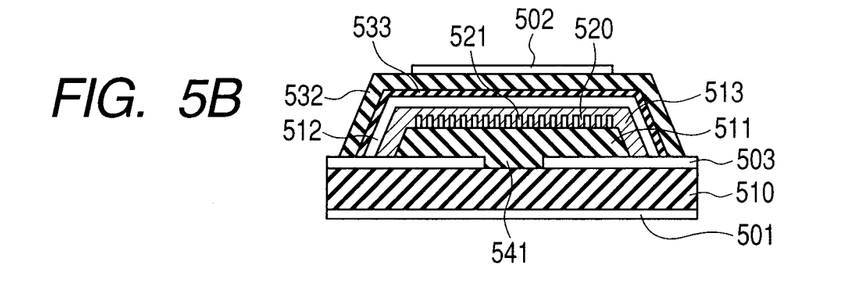

FIGS. 5A and 5B illustrate a structure of the surface emitting laser provided with the two-dimensional photonic crystal in the present exemplary embodiment. In FIGS. 5A and 5B, electrodes 501 and 502, a mask 503 for selective growth, a substrate and a contact layer 510, a lower cladding layer 511, an active layer 512 and a guide layer 513 containing a two-dimensional photonic crystal are shown.

A two-dimensional photonic crystal 520, a photonic crystal periodic structure 521, an upper cladding layer 532, an upper guide layer 533 and an aperture 541 are also shown.

Firstly, the layers having a structure illustrated in FIGS. 1A and 1B similar to that in Exemplary embodiment 1 were formed up to the lower cladding layer 511.

Next, an n-type guide layer is deposited thereon which is made of n-type GaN and has a thickness corresponding to the depth of holes of the two-dimensional photonic crystal.

Subsequently, the above described two-dimensional photonic crystal 520 is formed with a dry etching method. After this, a lower guide layer 513 made of the n-type GaN, in which the above described two-dimensional photonic crystal is embedded, was formed with the growth method as disclosed in the above described Science, Vol. 319, pp. 445-447, 25 Jan. 2008. Next, an active layer 512, a p-type guide layer 533 and a p-type cladding layer 532 are formed in this order.

Subsequently, an n-type electrode 501 is formed on the n-type contact layer 510, and the p-type electrode 502 is formed on the p-type cladding layer 532. Thereby, a surface emitting laser array is completed.

In the present exemplary embodiment, the active layer 512 is formed after the dry etching operation for forming the two-dimensional photonic crystal 520, which can inhibit the active layer 512 from being damaged by the dry etching operation, in comparison with Exemplary embodiment 1.

Here, the method for forming the two-dimensional photonic crystal 520 in the present exemplary embodiment is not particularly limited to the above described forming method.

For instance, firstly, a dielectric layer made of silicon dioxide or the like is formed on the upper part of the lower cladding layer 511.

After formation of the dielectric layer, a resist having a predetermined shape is formed on the dielectric layer with an electron beam exposure technique.

However, the above described dielectric substance in the present exemplary embodiment is not particularly limited to the above described silicon dioxide, and may be a medium which has a higher refractive index than that of the air and a lower refractive index than that of the guide layer 513.

For instance, a silicon nitride film ($SiN_x$) or the like can also be used.

Subsequently, the above described dielectric layer is dry-etched using the above described resist as a mask. Afterward, the above described resist is removed. Thereby, a periodic structure 521 of the two-dimensional photonic crystals is formed which are two-dimensionally and periodically arrayed in an in-plane direction and have a resonance mode in the in-plane direction.

Next, the n-type GaN layer is formed so as to embed the periodic structure 521 of the above described photonic crystals therein, with an MOCVD method. Thereby, the guide layer 513 containing a two-dimensional photonic crystal is formed.

Exemplary Embodiment 3

In Exemplary embodiment 3, a surface emitting laser array provided with the two-dimensional photonic crystal will be described which makes the mask for selective growth function as a current confinement layer by controlling the size of the aperture of the mask for selective growth to enhance its efficiency of injecting an electric current.

FIG. 5B illustrates a structure of the surface emitting laser provided with the two-dimensional photonic crystal in the present exemplary embodiment.

In the present exemplary embodiment, the size of the aperture 541 of the mask 503 for selective growth becomes smaller than that in Exemplary embodiment 2.

The surface emitting laser in the present exemplary embodiment has the same structure as that of Exemplary embodiment 2, except for the size of the aperture 541 of the mask 503 for selective growth.

In the present exemplary embodiment, the mask 503 for selective growth is formed which has the aperture 541 of a reduced size. Then, the lower cladding layer 511 made of n-type AlGaN is grown while promoting a lateral growth with an MOCVD method until the area of the upper part of the lower cladding layer 511 reaches an area necessary for the two-dimensional photonic crystal 520.

In the present exemplary embodiment, the production process is similar to that of Exemplary embodiment 2 except for the size of the aperture 541 of the mask 503 for selective growth and the lower cladding layer 511.

In the present exemplary embodiment, the size of the aperture 541 of the mask 503 for selective growth is reduced. Thereby, the mask 503 for selective growth functions as the current confinement layer when the electric current has been injected thereinto, and electric current can be highly efficiently injected into the active layer 512.

Incidentally, in the case shown in the present exemplary embodiment, the two-dimensional photonic crystal 520 is arranged in the lower side of the active layer 512 to have a structure similar to that in Exemplary embodiment 2.

However, in the surface emitting laser array of the present invention, the arrangement position of the two-dimensional photonic crystal 520 is not particularly limited.

For instance, the two-dimensional photonic crystal 520 may be arranged in the upper side of the active layer 512, which is a structure similar to that in Exemplary embodiment 1.

Exemplary Embodiment 4

A surface emitting laser array which will be described in Exemplary embodiment 4 is provided with a two-dimensional photonic crystal that has an inclined side wall surface produced with a dry etching method in place of an inclined side wall surface produced with a regrowing method with the use of the mask for selective growth shown in Exemplary embodiment 1 to Exemplary embodiment 3.

FIGS. 6A, 6B, 6C and 6D illustrate the structure of the surface emitting laser array provided with a two-dimensional photonic crystal in the present exemplary embodiment.

Figure 6A:
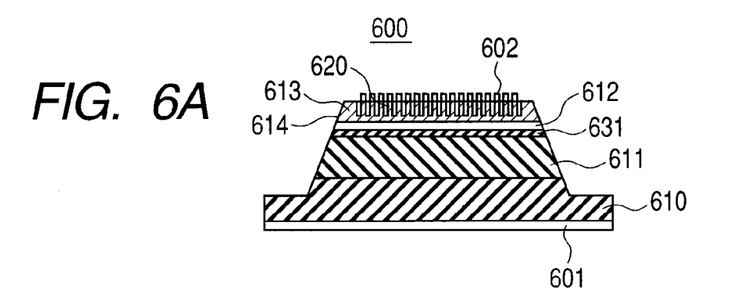
FIGS. 6A, 6B, 6C and 6D are views for describing the surface emitting laser provided with the two-dimensional photonic crystal according to Exemplary embodiment 4 of the present invention.
Figure 6B:
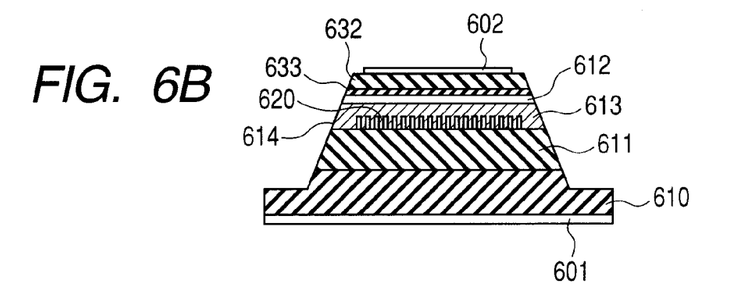

In FIGS. 6A and 6B, a surface emitting laser 600, electrodes 601 and 602, a substrate and contact layer 610, a lower cladding layer 611, an active layer 612, and a guide layer 613 containing a two-dimensional photonic crystal are shown.

A side wall surface 614, a two-dimensional photonic crystal 620, an upper cladding layer 632 and an upper guide layer 633 are also shown.

Firstly, a lower cladding layer 611 made of n-type AlGaN, a lower guide layer 631 made of n-type GaN, an active layer 612, and a p-type guide layer 613 made of p-type GaN are formed on a substrate 610 made of n-type GaN in this order with an MOCVD method.

Next, a multilayer film structure of semiconductors having an inclined side wall surface 614 is formed by forming the mesa therein with a dry etching method.

Here, the mesa is formed so that the angle formed by the surface of the p-type guide layer and the above described side wall surface exceeds the angle as illustrated in FIG. 2B, in other words, the mesa is formed so as to be inclined at an angle at which the incident light does not cause the total reflection on the interface between the guide layer 613 and the cladding layer 611.

Figure 6C:
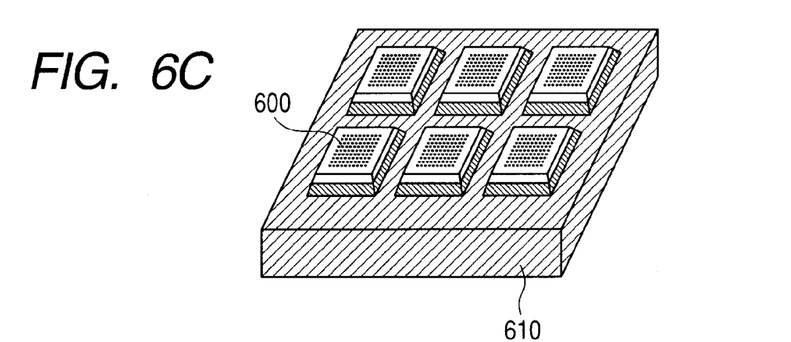

Subsequently, the two-dimensional photonic crystal 620 and the electrodes 601 and 602 were formed so as to form a structure which is illustrated in FIGS. 1A and 1B and is basically similar to that in Exemplary embodiment 1. Thus, a surface emitting laser array provided with the two-dimensional photonic crystal as illustrated in FIG. 6C was produced.

Here, in the present exemplary embodiment, the shape of the surface emitting laser is a normal mesa-shaped tetragon, but is not limited to the tetragon, and may be a hexagon, an octagon or even a circle, for instance.

In the present exemplary embodiment, the side wall surface of the surface emitting laser is a flat surface, but is not particularly limited to the flat surface.

Figure 6D:
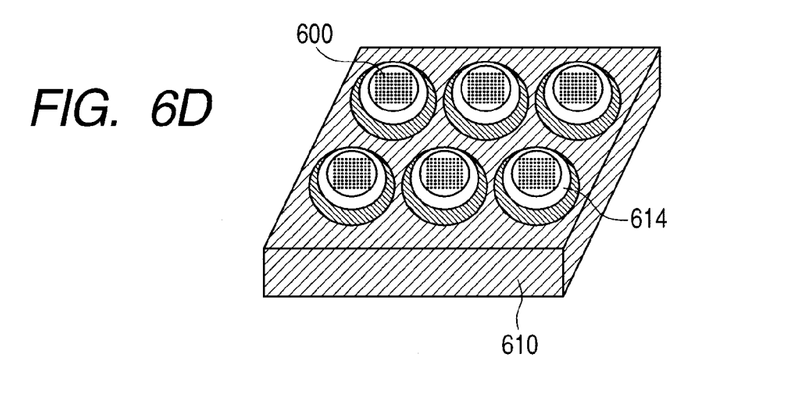

The surface may be a curved surface, for instance, as illustrated in FIG. 6D, as long as the angle formed by a plane containing a tangent line at an arbitrary place of the side wall surface of the guide layer containing the two-dimensional photonic crystal and the face of the two-dimensional photonic crystal exceeds the angle as illustrated in FIG. 2B, in other words, as long as the angle is an angle at which the incident light does not cause the total reflection on the interface of the guide layer and the cladding layer.

In addition, in the present exemplary embodiment, the arrangement of the surface emitting laser array is a tetragonal lattice shape, but is not particularly limited to the tetragonal lattice, and may be a triangular lattice, for instance. The surface emitting lasers can be arbitrarily arranged.

In addition, the case of using the n-type GaN substrate as a substrate was shown in the present exemplary embodiment, but the substrate is not particularly limited to the n-type GaN substrate, and may employ an SiC substrate, an Si substrate or a sapphire substrate, for instance, similarly to Exemplary embodiment 1.

In the present exemplary embodiment, the p-type electrode 602 is directly formed on the p-type guide layer 613 containing the two-dimensional photonic crystal, but the p-type electrode may be formed on a p-type cladding layer which is made of the p-type AlGaN and has been formed on the p-type guide layer 613 beforehand, similarly to Exemplary embodiment 1.

Incidentally, in the case shown in the present exemplary embodiment, the two-dimensional photonic crystal 620 is arranged in the upper side of the active layer 612 to have a structure similar to that in Exemplary embodiment 1.

However, in the surface emitting laser array of the present invention, the arrangement position of the two-dimensional photonic crystal is not particularly limited.

For instance, as is illustrated in FIG. 6B, the two-dimensional photonic crystal 620 may be arranged in the lower side of the active layer 612, which is a structure similar to that in Exemplary embodiment 2.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-112481, filed on May 7, 2009, which is hereby incorporated by reference herein in its entirety.

What is claimed is:

1. A surface emitting laser array comprising a plurality of surface emitting lasers arranged in an array, each of the surface emitting lasers being provided with a two-dimensional photonic crystal having a resonance mode in an in-plane direction and with an active layer, wherein the surface emitting laser has a mesa-shaped inclined side wall surface, wherein when a maximum light-receiving angle with respect to the mesa-shaped inclined side wall surface at which an incident light is coupled with a waveguide containing the two-dimensional photonic crystal is denoted as θmax°, an angle formed by a plane of the two-dimensional photonic crystal and the mesa-shaped inclined side wall surface is controlled so as to exceed (90+θmax)° or be smaller than (90−θmax)° and wherein the mesa-shaped inclined side wall surface is formed of a curved surface having the angle exceeding (90+θmax)° or smaller than (90−θmax)°.

2. The surface emitting laser array according to claim 1, wherein the two-dimensional photonic crystal is constituted by a semiconductor layer.

3. The surface emitting laser array according to claim 2, wherein the semiconductor layer is of a nitride semiconductor.

4. A method for producing a surface emitting laser array comprising a plurality of arranged surface emitting lasers each provided with a two-dimensional photonic crystal having a resonance mode in an in-plane direction and with an active layer, the method comprising the steps of:

forming a mask for selective growth having an opening aperture on a substrate;

forming a semiconductor layer provided with a mesa-shaped inclined side wall surface by selective growth starting from the aperture; and forming the two-dimensional photonic crystal in the semiconductor layer, wherein, in the step of forming the semiconductor layer, when a maximum light-receiving angle with respect to the inclined side wall surface at which an incident light couples with a waveguide containing the two-dimensional photonic crystal is denoted as θmax°, the semiconductor layer is formed so that an angle formed by a plane of the two-dimensional photonic crystal and the mesa-shaped inclined side wall surface exceeds (90+θmax)° or is smaller than (90−θmax)°, and wherein the mesa-shaped inclined side wall surface is formed of a curved surface having the angle exceeding (90+θmax)° or smaller than (90−θmax)°.

5. The method according to claim 4, wherein the semiconductor layer is of a nitride semiconductor.

* * * * *